United States Patent [19]

Anthony et al.

[11] 4,071,378

[45] Jan. 31, 1978

[54] PROCESS OF MAKING A DEEP DIODE SOLID STATE TRANSFORMER

[75] Inventors: Thomas R. Anthony; Harvey E. Cline, both of Schenectady, N.Y.

[73] Assignee: General Electric Company, Schenectady, N.Y.

[21] Appl. No.: 738,709

[22] Filed: Nov. 4, 1976

Related U.S. Application Data

[60] Division of Ser. No. 553,903, Feb. 27, 1975, Pat. No. 4,024,565, which is a continuation of Ser. No. 410,999, Oct. 30, 1973, abandoned.

[51] Int. Cl.² .......................................... H01L 21/225
[52] U.S. Cl. ...................................... 148/1.5; 148/171; 148/177; 148/188; 252/62.3 GA; 357/55
[58] Field of Search ................. 148/1.5, 171, 172, 177, 148/179, 187, 188; 357/51, 55, 60, 88–90; 252/62.3 E, 62.3 GA

[56] References Cited

U.S. PATENT DOCUMENTS 3,614,554  10/1971  Shield et al. ........................... 357/51
3,936,319  2/1976  Anthony et al. ................. 148/188 X

OTHER PUBLICATIONS

Keonjian, Microelectronics, McGraw-Hill Book Co., N.Y., 1963, pp. 109 and 110.

Primary Examiner—G. Ozaki
Attorney, Agent, or Firm—Donald M. Winegar; Joseph T. Cohen; Jerome C. Squillaro

[57] ABSTRACT

An array of columnar structures are provided in a body of semiconductor material. The material of each columnar structure is recrystallized material of the body having solid solubility of dopant metal therein. Means are provided for connecting the columnar structures into two series electrical circuit arrangements to function respectively as the primary and secondary windings of a deep diode solid state transformer.

9 Claims, 5 Drawing Figures

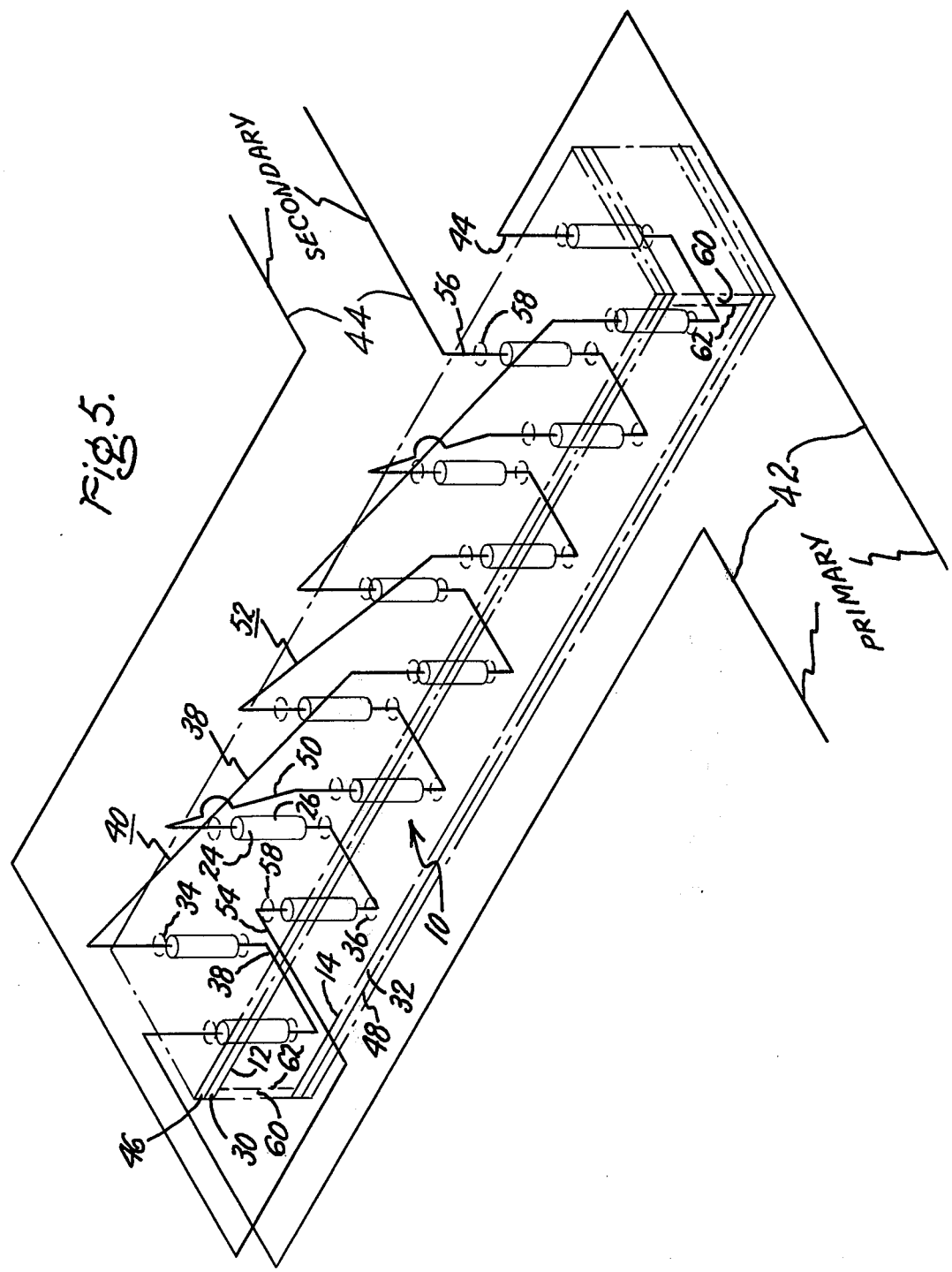

PROCESS OF MAKING A DEEP DIODE SOLID STATE TRANSFORMER

CROSS-REFERENCE TO RELATED APPLICATIONS

This application is a division of application Ser. No. 553,903, filed on Feb. 27, 1975, and now U.S. Pat. No. 4,024,565, and which in turn is a continuation of application Ser. No. 410,999, filed on Oct. 30, 1973 and now abandoned.

BACKGROUND OF THE INVENTION

1. Field of the Invention

This invention relates to solid state transformers and a process of making the same.

2. Description of the Prior Art

Heretofore, solid state transformers have not been fabricated in substrates of integrated circuits because of fabrication limitations. Circuit and chip designers employ a variety of circuits to design around this process limitation.

An object of this invention is to provide a solid state transformer for integrated circuits.

Another object of this invention is to provide a process for making a solid state transformer.

Other objects of this invention will, in part, be obvious and will, in part, appear hereinafter.

BRIEF DESCRIPTION OF THE INVENTION

In accordance with the teachings of this invention, there is provided a deep diode solid state transformer. The transformer comprises a body of single crystal semiconductor material having first and second major opposed surfaces, a selected resistivity and a first type conductivity. A plurality of regions of second and opposite type conductivity and a selected resistivity is disposed in the body. Each region extends between and terminates in the two major opposed surfaces and has two opposed end surfaces. Each of the two end surfaces is coextensive with only one of the major surfaces. The material of each of the regions is recrystallized semiconductor material of the body having solid solubility of a material therein to impart the second type conductivity and selective level of resistivity thereto. Each of the regions is a low electrical resistance path for conducting electrical currents between the opposed surfaces of the body. A P-N junction is formed by the contiguous surfaces of the materials of each region and the body. First means are provided for electrically connecting selective ones of the plurality of regions into a series circuit arrangement so as to function as a primary winding of a transformer. Second means are provided for electrically connecting the remaining ones of the plurality of regions into a series circuit arrangement so as to function as a secondary winding of the same transformer. The regions are made by the thermal migration of metal droplets embodying the temperature gradient zone melting process.

DESCRIPTION OF THE DRAWINGS

FIG. 5 is an isometric view, partly in cross-section, of the deep diode solid state transformer made in accordance with the teachings of this invention.

DESCRIPTION OF THE INVENTION

Figure 1:
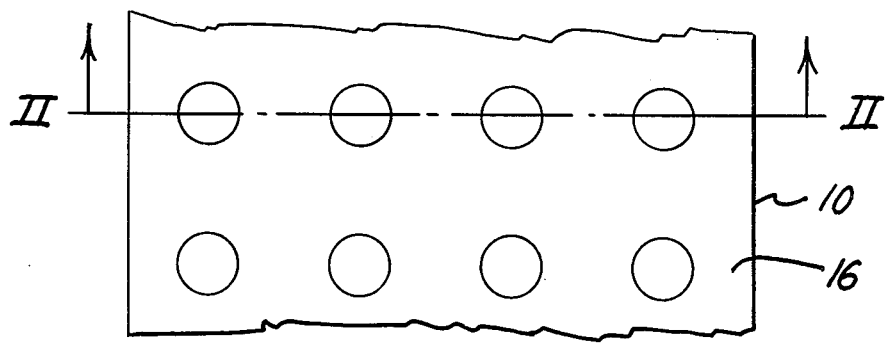
FIG. 1 is a top planar view of a body of semiconductor material being processed in accordance with the teachings of this invention.
Figure 2:
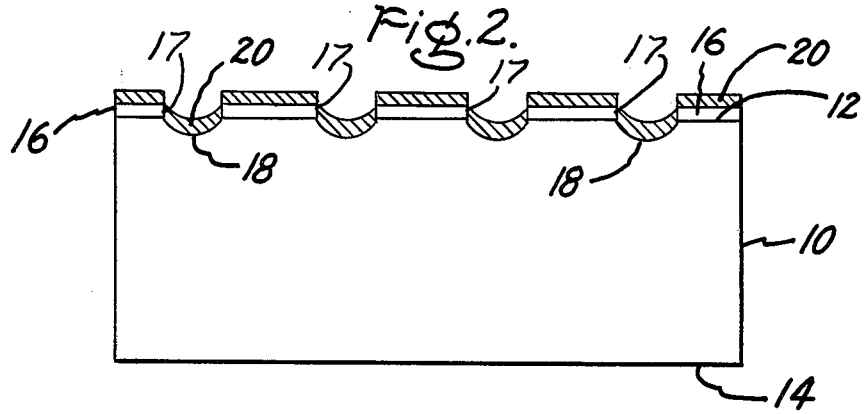
FIG. 2 is an elevation view, in cross-section of the body of FIG. 1 taken along the cutting plane II—II.

With reference to FIGS. 1 and 2 there is shown a body 10 of semiconductor material having a selected resistivity and a first type conductivity. The body 10 has opposed major surface 12 and 14 which are the top and bottom surfaces respectively thereof. The semiconductor material comprising the body 10 may be silicon, germanium, silicon carbide, gallium arsenide, a compound of a Group II element and a Group VI element, and a compound of a Group III element and a Group V element.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80° C. A suitable mask defining one or more geometrical shapes such, for example, as a circle or a square is disposed on the layer of photoresist and exposed to ultraviolet light. After exposure, the layer of photoresist is washed in xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$—HF). The etching is continued until a second set of windows 17 corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a solution of 1 part of hydrogen peroxide and 1 part of concentrated sulphuric acid immediately after mixing.

Selective etching of the exposed surface of areas of body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° to 30° C, the mixed acid solution selectively etches the silicon of the body 10 at a rate of approximately 5 microns per minute. A depression 18 is etched in the surface 12 of the body 10 beneath each window 17 of the oxide layer 16. The selective etching is continued until the depth of the depression 18 is approximately equal to the diameter or width of the window 17 in the silicon oxide layer 16. However, it has been discovered, that the depression 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25° C will result in a depression 18 of from 25 to 30 microns in depth for a window 17 of a diameter or width of from 10 to 500 microns. The etched body 10 is rinsed in distilled water and blown dry. Preferably, a gas such, for example, as freon, argon and the like, is suitable for drying the processed body 10.

The processed body 10 is disposed in a metal evaporation chamber. A metal layer 20 is deposited on the remaining portions of the layer 16 of silicon oxide and on the exposed silicon in the depressions 18. The metal in the depressions 18 are the metal discs, droplets or buttons to be migrated through the body 10. The metal of the layer 20 comprises a material, either substantially pure in itself or suitably doped by one or more materials to impart a second and opposite type conductivity to the materials of the body 10 through which it migrates. The thickness of the layer 20 is approximately equal to the depth of the depressions 18. Thus, the layer 20 is approximately 20 microns in thickness. A suitable material for the metal layer 20 is aluminum to obtain P-type regions in N-type silicon semiconductor material. Prior to migrating the metal discs, droplets or buttons in the troughs 18 through the body of silicon 10, the excess metal of the layer 20 is removed from the silicon oxide layer 16 by such suitable means as grinding away the excess metal with a 600 grit carbide paper or by selective etching.

It has been discovered that the vapor deposition of the layer 20 of aluminum metal should be performed at a pressure of approximately $1 \times 10^{-5}$ torr but not greater than $5 \times 10^{-5}$ torr. When the pressure is greater than $3 \times 10^{-5}$ torr, we have found that in the case of aluminum metal deposited in the depression 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the silicon body 10 are by the electron beam method and the like wherein little if any oxygen can be trapped in the aluminum.

Figure 3:
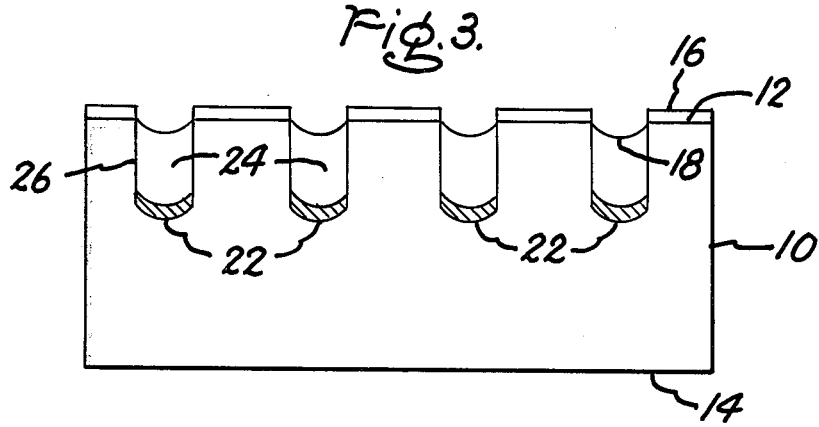
FIGS. 3 and 4 are elevation views, in cross-section, of the body of FIGS. 1 and 2 being processed further in accordance with the teachings of this invention.
Figure 4:
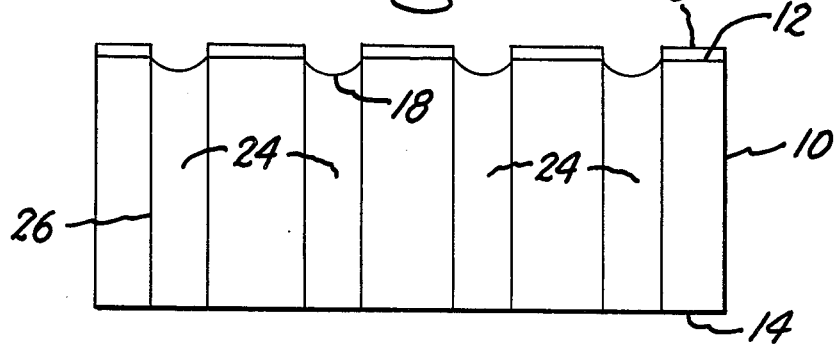

Referring now to FIG. 3, the processed body 10 is placed in a thermal migration apparatus, not shown, and the metal in the depressions 18 forms a droplet 22 of metal-rich alloy of the material of the body 10 in each etched area of surface 12 and is migrated through the body 10 by a thermal gradient zone melting process. A thermal gradient of approximately 50° C per centimeter between the bottom surface 14, which is the hot face, and the surface 12, which is the cold face, has been discovered to be appropriate for an average temperature of the body 10 of from 700° to 1350° C. The process is practiced for a sufficient length of time to migrate the metal-rich droplet 22 through the body 10. For example, for aluminum metal of 20 microns thickness, a thermal gradient of 50° C/centimeter, a temperature of the body 10 of 1100° C, a pressure of $1 \times 10^{-5}$ torr, a furnace time of less than 12 hours is required to migrate the metal-rich droplet 22 through a silicon body 10 of 1 centimeter thickness. The completed structure after processing is shown in FIG. 4.

The thermal migration of the droplet 22 forms a region 24 of recrystallized material of the body 10 having solid impurity of the metal 20 therein. The conductivity type of the material of the region 24 is a different and opposite type thereby forming a P-N junction by the contiguous surfaces of the materials of opposite type conductivity. The resistivity of the region 24 is dependent on the metal migrated through the body 10.

It has been discovered that when the body 10 is of silicon, germanium, silicon carbide, gallium arsenide semiconductor material and the like, the droplet 22 has a preferred shape which also gives use to the region 24 being of the same shape as the droplet 22. In a crystal axis direction of $<111>$ of thermal migration, the droplet 22 migrates as a triangular platelet laying in a (111) plane. The platelet is bounded on its edges by (112) planes. A droplet 22 larger than 0.10 centimeter on an edge is unstable and breaks up into several droplets during migration. A droplet 22 smaller than 0.0175 centimeter may not migrate into the body 10 because of a surface barrier problem.

The ratio of the droplet migration rate over the applied thermal gradient is a function of the temperature at which thermal migration of the droplet 22 is practiced. At high temperatures, of the order of from 1100° C to 1400° C, the droplet migration velocity increases rapidly with increasing temperature. A velocity of 10 centimeters per day or $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

A droplet 22 migrates in the $<100>$ crystal axis direction as a pyramidal bounded by four forward (111) planes and a rear (100) plane. Careful control of the thermal gradient and migration rate is a necessity. Otherwise, a twisted region 24 may result. It appears that there is a non-uniform dissolution of the four forward (111) facets in that they do not always dissolve at a uniform rate. Non-uniform dissolution of the four forward (111) facets may cause the regular pyramidal shape of the droplet to become distorted into a trapezoidal shape.

For a more thorough understanding of the temperature gradient zone melting process and the apparatus employed for the process, one is directed to our co-pending applications entitled Method of Making Deep Diode Devices, Ser. No. 411,150, and now U.S. Pat. No. 3,901,736; High Velocity Thermal Migration Method of Making Deep Diodes; Ser. No. 411,021, and now U.S. Pat. No. 3,910,801; Deep Diode Devices and Method and Apparatus, Ser. No. 411,001, and now abandoned in favor of a continuation Ser. No. 552,154; High Velocity Thermomigration Method of Making Deep Diodes, Ser. No. 411,015, and now U.S. Pat. No. 3,898,106; Deep Diode Device and Method, Ser. No. 411,009, and now U.S. Pat. No. 3,902,925; and the Stabilized Droplet Method of Making Deep Diodes Having Uniform Electrical Properties, Ser. No. 411,008, and now U.S. Pat. No. 3,899,361; filed concurrently with this patent application and assigned to the same assignee of this invention.

The regions of recrystallized material exhibits substantially theoretical physical values depending upon the materials involved. Various materials may be migrated into the body 10 to provide various resistivites and conductivity types therein.

Upon completion of the thermal migration of the metal droplets to form the columnar array, selective etching and the like is employed to remove the remaining layer 16 of silicon oxide and any damaged material from the surface 12. The surface 12 may be processed to remove material to eradicate the depressions 18. Alternatively, the depressions 18 may be left on the surface 12. Referring now to FIG. 5, layers 30 and 32 of an electrically insulating material such, for example, as silicon oxide, silicon nitride, aluminum oxide and the like are disposed on the respective surfaces 12 and 14 of the processed body 10 by any of the methods well known to those skilled in the art. Employing photolithographical techniques and selective etching well known to those skilled in the art, windows 34 and 36 are opened in the respective layers 30 and 32 to expose selective end surface areas of each region 24. The exposed portions of the P-N junctions 26 in the surfaces 12 and 14 are still protected by the respective insulating layers 30 and 32. Again employing photolithographical techniques and selective etching a plurality of electrical contacts 38 comprising a suitable metal such, for example, as tin, aluminum, gold and the like are disposed on the respective layers 30 and 32 and exposed selective end surfaces of the regions 24 therein and so arranged as to produce a simple or complex solid state helical coil 40 in the body 10. The coil 40 functions as one of the windings of a solid state transformer. In a similar manner, electrical insulating layers 46 and 48 are disposed on the respective layers 30 and 32 and contacts 38. Photolithographical techniques and selective etching is employed to expose selective end surfaces of the remaining regions 24 and electrical contacts 50 affixed thereto to interconnect these remaining columnar regions 24 into a series electrical circuit which functions as an induction coil 52. The coil 52 functions as another winding of a solid state transformer. Electrical leads 54 and 56 are connected to the coil 52 to connect the coil 40 into external electrical circuitry. Windows 58 are opened in the layers 46 and 30 by suitable means as described before to enable electrical leads 42 and 44 to be affixed to the coil 40 in order to connect the coil 40 into an external electrical circuit.

When employed in integrated circuits and the like, it is preferred that a deep diode solid state transformer be electrically isolated from the other electrical devices in the common substrate which they share. Therefore, with reference to FIG. 5 again, and embodying the process of thermal migration of metal wires in a manner similar to the thermal migration of the metal droplets 22, an electrically insulating grid comprising P-type conductivity regions 60 and accompanying P-N junctions 62 is formed in the body 10. The grid comprises regions 60 which may extend the full width and depth of the body 10 or a plurality of intesecting planar regions 60 may be employed to electrically isolate the transformer from the remainder of the electrical circuits and devices in the body 10. The plurality of regions 60 encompasses the whole solid state transformer, as required. For clarity only and to illustrate the intended purpose of the planar regions 60, only one end portion and one side portion are shown to prevent unnecessary complication of the view of FIG. 5. For a more thorough discussion of electrical isolation grids and process of making the same, one is directed to the following copending applications, which are filed on the same day as this patent application and assigned to the same assignee, entitled: "Isolation Junctions For Semiconductor Devices," Ser. No. 411,012, and now abandoned in favor of a continuation-in-part Ser. No. 519,914, and now U.S. Pat. No. 3,995,309, and in favor of a continuation Ser. No. 556,726, and now U.S. Pat. No. 3,988,763; and "Thermomigration of Metal-Rich Liquid Wires Through Semiconductor Materials," Ser. No. 411,018, and now U.S. Pat. No. 3,899,362.

Although the solid state transformer is shown as a simple primary and secondary winding configuration, one may make other configurations easily by employing the appropriate size array of regions 24 and the proper electrical interconnecting patterns.

The thermal migration of metal wires is preferably practiced in accordance with the planar orientations, migration directions, stable wire directions and stable wire sizes of the following Table.

Table

| Wafer Plane | Migration Direction | Stable Wire Directions | Stable Wire Sizes |
|---|---|---|---|
| (100) | $<100>$ | $<01\bar{1}>$* | 100 microns |
|  |  | $<0\bar{1}1>$* | 100 microns |
| (110) | $<110>$ | $<1\bar{1}0>$* | 150 microns |
| (111) | $<111>$ | (a) $<01\bar{1}>$ |  |
|  |  | $<10\bar{1}>$ | 500 microns |
|  |  | $<\bar{1}10>$ |  |
|  |  | (b) $<11\bar{2}>$* |  |
|  |  | $<\bar{2}11>$* | 500 microns |
|  |  | $<1\bar{2}1>$* |  |
|  |  | (c) Any other Direction in (111) plane* | 500 microns |

*The stability of the migrating wire is sensitive to the alignment of the thermal gradient with the $<100>$, $<110>$ and $<111>$ axis, respectively.
+Group a is more stable than group b which is more stable than group c.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in the inert gaseous atmosphere of hydrogen, helium, argon and the like in a furnace having a positive atmosphere.

We claim as our invention:

1. A process for making a semiconductor device comprising the process steps of:
   a. forming a plurality of droplets of a selective metal on a selective portion of a major surface area of a body of semiconductor material having two major opposed surfaces;
   b. establishing a thermal gradient substantially along an axis of the body perpendicular to the two major opposed surfaces;
   c. thermal migrating the plurality of droplets of selective metal through the body in the direction of the higher temperature of the thermal gradient from the one major surface to the, and terminating in, the other of the two major opposed surfaces to form a plurality of regions of recrystallized material of the body each having two opposed end surfaces, each end surface being coextensive with only one of the two major surfaces, solid solubility of the selective metal therein and a second and opposite type conductivity than the body and also forming a P-N junction at the contiguous surfaces of each of the regions and the body;
   d. affixing electrical contact means to selective end surfaces of selective regions to form a series circuit thereof to function as a primary winding of a transformer, and e. affixing electrical contact means to selective end surfaces of the remainder of the regions to form a series circuit thereof to function as a primary winding of the same transformer.

2. The process of claim 1 including practicing the process step prior to the forming of the mass of selective metal of selectively etching a selective portion of the major surface of the body to form a depression therein into which the mass of metal is deposited.

3. The process of claim 2 wherein
the mass of metal is vapor deposited.

4. The process of claim 2 wherein
the major surfaces have a preferred planar crystal orientation of (111), and
the axis of the body is oriented in a crystal axis direction of <111>.

5. The process of claim 4 wherein
the material of the body is silicon, silicon carbide, germanium, and gallium arsenide.

6. The process of claim 5 wherein
the material of the body is silicon of N-type conductivity and
the solid solubility material in the recrystallized silicon is aluminum.

7. The process of claim 2 wherein
the major surfaces have a preferred planar crystal orientation of (100), and
the axis of the body is oriented in a crystal axis direction of <100>.

8. The process of claim 7 wherein
the material of the body is silicon, silicon carbide, germanium and gallium arsenide.

9. The process of claim 8 wherein
the material of the body is silicon of N-type conductivity, and
the solid solubility material in the recrystallized silicon is aluminum.

* * * * *